United States Patent
Weng et al.

(10) Patent No.: US 10,656,744 B2
(45) Date of Patent: May 19, 2020

(54) THIN FILM TRANSISTOR ARRAY SUBSTRATE AND TOUCH DISPLAY PANEL USING SAME

(71) Applicant: HON HAI PRECISION INDUSTRY CO., LTD., New Taipei (TW)

(72) Inventors: Yu-Fu Weng, New Taipei (TW); Chien-Wen Lin, New Taipei (TW); Chia-Lin Liu, New Taipei (TW); Tzu-Yu Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/207,965

(22) Filed: Dec. 3, 2018

(65) Prior Publication Data

US 2019/0369783 A1    Dec. 5, 2019

(30) Foreign Application Priority Data

Jun. 5, 2018   (CN) .......................... 2018 1 0581624

(51) Int. Cl.

| | | |
|---|---|---|
| *G06F 3/041* | (2006.01) | |
| *G06F 3/044* | (2006.01) | |
| *G02F 1/1343* | (2006.01) | |
| *G02F 1/1368* | (2006.01) | |
| *H01L 27/12* | (2006.01) | |
| *G02F 1/1333* | (2006.01) | |

(52) U.S. Cl.
CPC .......... *G06F 3/0412* (2013.01); *G02F 1/1368* (2013.01); *G02F 1/13338* (2013.01); *G02F 1/134309* (2013.01); *G06F 3/044* (2013.01); *G06F 3/0416* (2013.01); *H01L 27/124* (2013.01); *G02F 2201/121* (2013.01)

(58) Field of Classification Search
None
See application file for complete search history.

(56) References Cited

U.S. PATENT DOCUMENTS

| | | | |
|---|---|---|---|
| 2013/0147724 A1* | 6/2013 | Hwang | G06F 3/0412 345/173 |
| 2013/0241868 A1* | 9/2013 | Kim | G09G 3/3685 345/174 |
| 2017/0097702 A1* | 4/2017 | Chang | G06F 3/044 |

FOREIGN PATENT DOCUMENTS

CN          206515801 U       9/2017

* cited by examiner

*Primary Examiner* — Nicholas J Lee
(74) *Attorney, Agent, or Firm* — ScienBiziP, P.C.

(57) ABSTRACT

A thin film transistor array substrate in a touch display panel having reinforced common voltage uniformity on sub-electrodes therein includes a common electrode layer, a driving circuit, a controlling switch, a plurality of first lines, at least one second line, and at least one third line. The common electrode layer includes the spaced sub-electrodes. Each sub-electrode uses a first line electrically connect to the driving circuit and the controlling switch. The at least one second line is electrically connected to the driving circuit and the controlling switch, and when the controlling switch is turned on, the second line is electrically connected to the first lines, the driving circuit thus applying a common voltage to the sub-electrodes. A touch display panel using the thin film transistor array substrate is also provided.

16 Claims, 4 Drawing Sheets

THIN FILM TRANSISTOR ARRAY SUBSTRATE AND TOUCH DISPLAY PANEL USING SAME

FIELD

The subject matter herein generally relates to display devices.

BACKGROUND

FIG. 1 shows a thin film transistor array substrate 30 used in a touch display panel of prior art. The thin film transistor array substrate 30 includes a substrate 31. On the substrate 31 there are a driving circuit 32, a common electrode layer 33, and a plurality of lines 36. The common electrode layer 33 includes a plurality of sub-electrodes 34 spaced apart from each other. The sub-electrodes 34 use the lines 36 electrically connect to the driving circuit 32. However, the lines 36 electrically connecting the sub-electrodes 34 away from the driving circuit 32 are too long, resulting in high resistance and capacitance loading. Thus, a common voltage uniformity on the sub-electrodes 34 is poor, and a display function of the touch display panel is affected.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
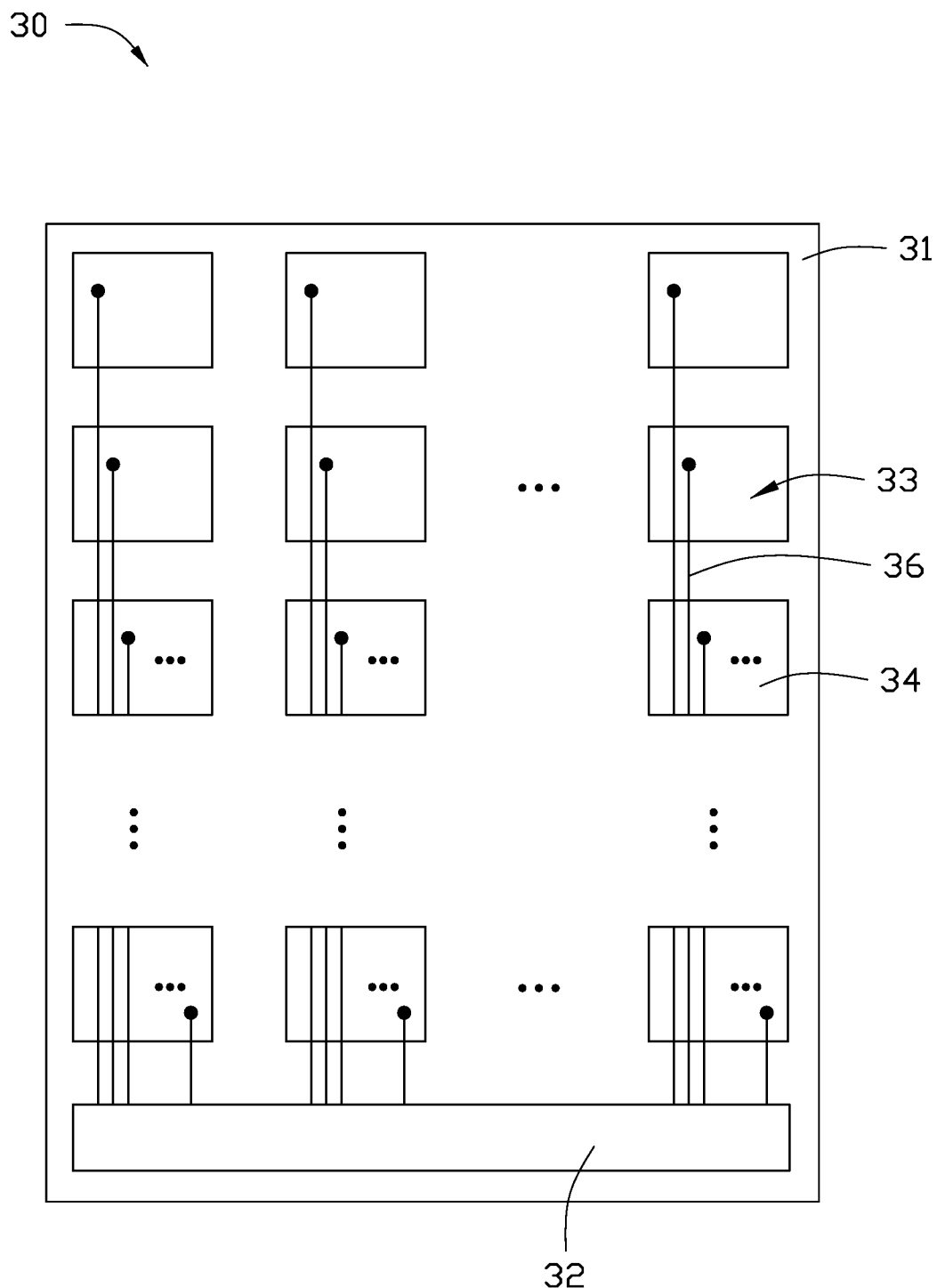
FIG. 1 is a plan view of a thin film transistor array substrate according to prior art.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the common, identical embodiment, and such references can mean "at least one". The term "circuit" is defined as an integrated circuit (IC) with a plurality of electric elements, such as capacitors, resistors, amplifiers, and the like.

First Embodiment

Figure 2:
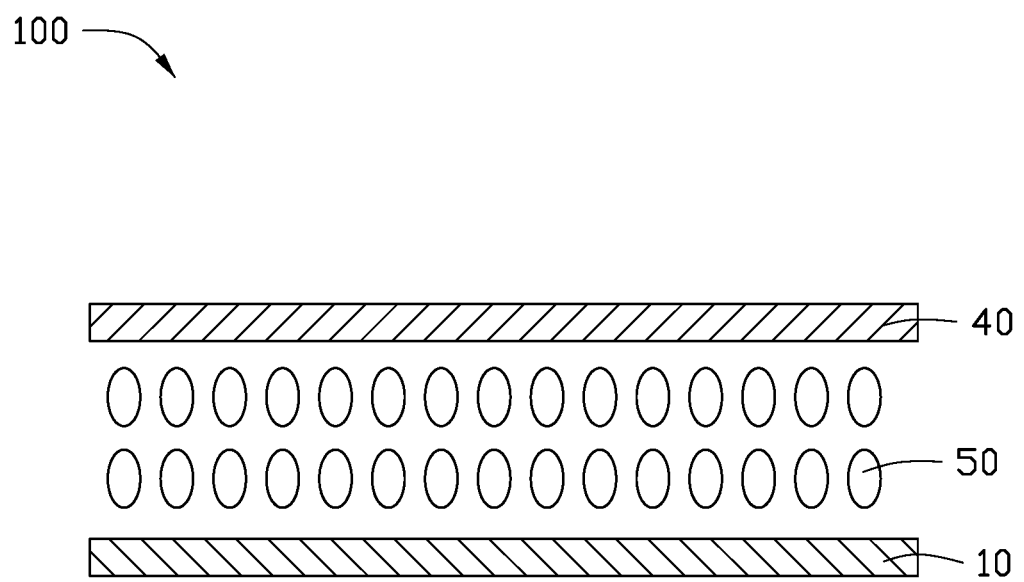
FIG. 2 is a plan view of an embodiment of a touch display panel.

FIG. 2 shows an embodiment of a touch display panel 100. In the present embodiment, the touch display panel 100 is an in-cell touch display panel including touch electrodes provided within a display panel. The touch display panel 100 includes a color filter substrate 40, a thin film transistor substrate 10, and a liquid crystal layer 50 between the color filter substrate 40 and the thin film transistor substrate 10.

The touch display panel 100 in this disclosure may be used for any product having a display function, such as a mobile phone, a tablet computer, a television, a display, a notebook computer, a digital photo frame, a navigator, and the like.

Figure 3:
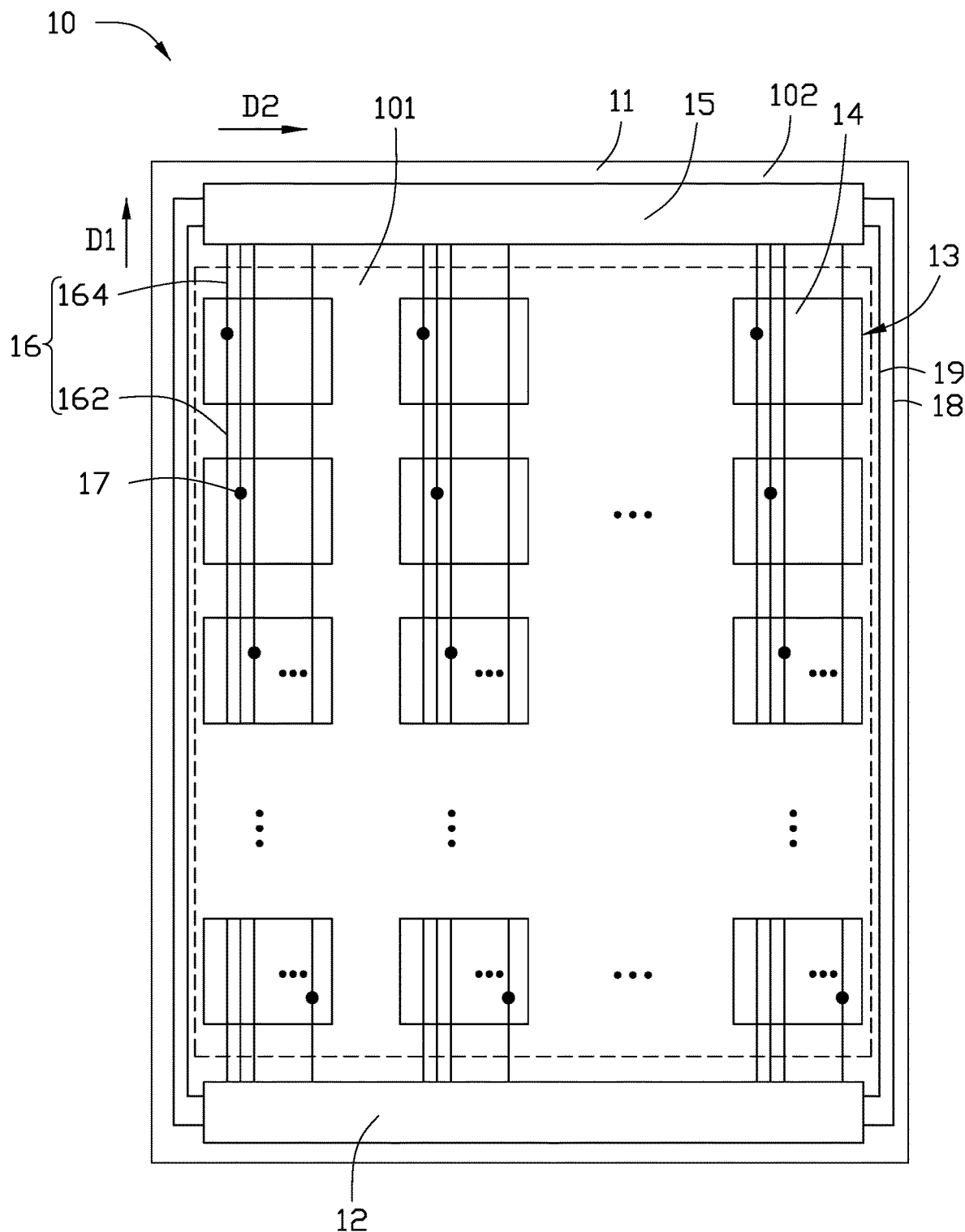
FIG. 3 is a plan view of a first embodiment of a thin film transistor array substrate of the touch display panel of FIG. 2.

FIG. 3 shows a first embodiment of the thin film transistor array substrate. The thin film transistor array substrate 10 includes a substrate 11. On the substrate 11, there are a driving circuit 12, a common electrode layer 13, a controlling switch 15, a plurality of first lines 16, at least one second line 19, and at least one third line 18.

In the present embodiment, the substrate 11 carries the driving circuit 12, the common electrode layer 13, the controlling switch 15, the first lines 16, the at least one second line 19, and the at least one third line 18. The substrate 11 may be a rigid substrate, such as a glass substrate, or may be a flexible substrate, such as a polyimide plastic substrate.

In the present embodiment, the thin film transistor array substrate 10 further includes an intermediate layer (not shown). The intermediate layer is between the substrate 11 and the common electrode layer 13. The intermediate layer is a multi-layer structure. The intermediate layer may include a thin film transistor array, an insulating layer, a plurality of pixel electrodes, a plurality of scanning lines, and a plurality of data lines, and so on. The common electrode layer 13 may be formed of transparent conductive materials.

The common electrode layer 13 includes a plurality of sub-electrodes 14 spaced apart from each other. The sub-electrodes 14 are arranged in a matrix having a plurality of rows in a first direction D1 and a plurality of columns in a second direction D2. The first direction D1 intersects with the second direction D2. In the present embodiment, the first direction D1 is perpendicular to the second direction D2. The sub-electrodes 14 are electrically insulated from each other. The driving circuit 12 can apply a voltage to the sub-electrodes 14. The voltage can be a touch driving voltage or a common voltage.

In the present embodiment, the driving circuit 12 can apply the touch driving voltage and the common voltage to the sub-electrodes 14 in a time division method. The sub-electrodes 14 can serve as the common electrodes and are multiplexed as touch electrodes. When the sub-electrodes 14 serve as the common electrodes, each sub-electrode 14 receives the common voltage from the driving circuit 12 to acting as display. When the sub-electrodes 14 serve as the touch electrodes, each sub-electrode 14 receives the touch driving voltage from the driving circuit 12, in the detection of touch operations and touch positions.

The thin film transistor array substrate 10 defines a touch area 101 and a non-touch area 102. The non-touch area 102 surrounds the touch area 101. The common electrode layer 13 is in the touch area 101. The driving circuit 12 and the controlling switch 15 are in the non-touch area 102, and the driving circuit 12 and the controlling switch 15 are on opposite sides of the touch area 101.

Each sub-electrode 14 uses a first line 16 to electrically connect the driving circuit 12 and the controlling switch 15. In the present embodiment, the first lines 16 are formed of a conductive layer (not shown) different from the common electrode layer 13, and an insulating layer (not shown) between the conductive layer and the common electrode layer 13. The insulating layer defines a plurality of via holes 17. Each first line 16 extends through one column of the sub-electrodes 14 in the first direction D1 and the first lines 16 are spaced apart in the second direction D2. Each first line 16 is electrically connected to one sub-electrode 14 by one via hole 17.

In the present embodiment, a section of the first line 16 extending from the driving circuit 12 to the via hole 17 is defined as a first sub-line 162, and a section of the first line 16 extending from the via hole 17 to the controlling switch 15 is defined as a second sub-line 164.

According to the distance of the sub-electrodes 14 from the driving circuit 12, the lengths of the first sub-lines 162 electrically connected to different sub-electrodes 14 in a same column of the sub-electrodes 14 are sequentially decreased or sequentially increased. The lengths of the second sub-lines 164 electrically connected to the sub-electrodes 14 of the same column of the sub-electrodes 14 are also sequentially increased or decreased.

In the present embodiment, the controlling switch 15 and the driving circuit 12 are on opposite sides of the sub-electrodes 14 in the first direction D1. The driving circuit 12 is on the bottom side of the substrate 11, and the controlling switch 15 is on the top side of the substrate 11. In each column of sub-electrodes 14, the lengths of the first sub-lines 162 are sequentially decreased in the second direction D2, and the lengths of the second sub-lines 164 are sequentially increased in the second direction D2.

The second lines 19 and the third lines 18 are in the non-touch area 102. Each third line 18 is electrically connected to the driving circuit 12 and the controlling switch 15. The driving circuit 12 controls the controlling switch 15 by the third lines 18. Each second line 19 is electrically connected to the driving circuit 12 and the controlling switch 15.

During a display period, the sub-electrodes 14 serve as common electrodes to receive the common voltage. The driving circuit 12 uses the third lines 18 to turn on the controlling switch 15. The second lines 19 are electrically connected to the second sub-lines 164. By the first sub-lines 162, the driving circuit 12 applies a first common voltage to each sub-electrode 14. By the second sub-lines 164, the driving circuit 12 applies a second common voltage to each sub-electrode 14. The first common voltage equals the second common voltage. The RC loading (resistive capacitive load) of the sub-electrodes 14 away from the drive circuit 12 is reduced by the influence of the double-driving. Thus, the common voltage uniformity on different sub-electrodes 14 is improved, and the display effect is improved.

During a touch period, the sub-electrodes 14 serve as self-capacitance sub-electrodes to receive the touch driving voltage. By the third lines 18, the driving circuit 12 turns the controlling switch 15 off, the second lines 19 are not electrically connected to the first lines 16. The driving circuit 12 applies the touch driving voltage to each sub-electrode 14 by the first sub-lines 162. The touch driving voltage is an alternating voltage. The alternating voltage may be a sine wave, a square wave, a triangular wave, a sawtooth wave, or the like.

When a conductive object (such as a fingertip) touches a touch surface of the touch display panel 100, the capacitance sensing signal at the touch position is different. The driving circuit 12 receives and processes the capacitance sensing signal of each sub-electrode 14. By processing and calculating the differences in the capacitance sensing signals, the coordinates of the touch position can be determined.

Second Embodiment

Figure 4:
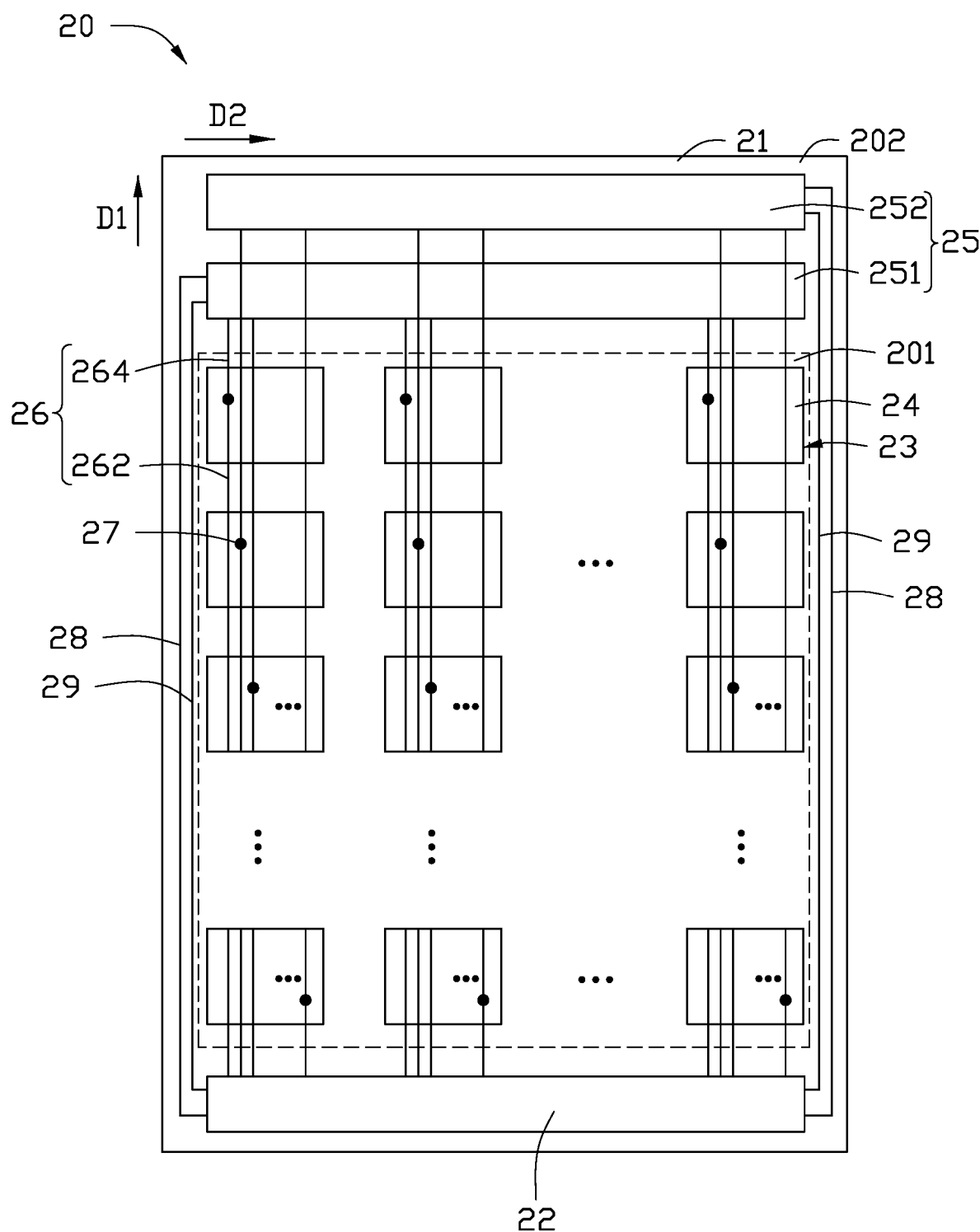
FIG. 4 is a plan view of a second embodiment of the thin film transistor array substrate of the touch display panel of FIG. 2.

FIG. 4 shows another embodiment of the thin film transistor array substrate. In FIG. 4, the thin film transistor array substrate 20 is substantially the same as the thin film transistor array substrate 10 of the first embodiment. The thin film transistor array substrate 20 also includes a substrate 21. On the substrate 21, there are a driving circuit 22, a common electrode layer 23, a controlling switch 25, a plurality of first lines 26, at least one second line 29, and at least one third line 28. The substrate 21 carries the driving circuit 22, the common electrode layer 23, the controlling switch 25, the first lines 26, the at least one second line 29, and the at least one third line 28.

In the present embodiment, the substrate 21 carries the driving circuit 22, the common electrode layer 23, the controlling switch 25, the first lines 26, the at least one second line 29, and the at least one third line 28. The substrate 21 may be a rigid substrate, such as a glass substrate, or may be a flexible substrate, such as a polyimide plastic substrate.

The difference between the thin film transistor array substrate 20 and the thin film transistor array substrate 10 is that the thin film transistor array substrate 20 includes two controlling switches, the thin film transistor array substrate 10 in the first embodiment includes only one controlling switch. In the present embodiment, the controlling switch 25 includes a first controlling switch 251 and a second controlling switch 252. Some of the sub-electrodes 24 use the first lines 26 to electrically connect to the driving circuit 22 and the first controlling switch 251. The other sub-electrodes 24 use the first lines 26 electrically connect to the driving circuit 22 and the second controlling switch 252.

The thin film transistor array substrate 20 defines a touch area 201 and a non-touch area 202. The non-touch area 202 surrounds the touch area 201. The common electrode layer 23 is in the touch area 201. The driving circuit 22 and the controlling switch 25 are in the non-touch area 202, and the controlling switch 25 and the driving circuit 22 are on opposite sides of the touch area 201.

In the present embodiment, the thin film transistor array substrate 20 further includes an intermediate layer (not shown). The intermediate layer is between the substrate 21 and the common electrode layer 23. The intermediate layer is a multi-layer structure. The intermediate layer may include a thin film transistor array, an insulating layer, a plurality of pixel electrodes, a plurality of scanning lines, a plurality of data lines, and so on. The common electrode layer 23 may be formed of transparent conductive materials.

The common electrode layer 23 includes a plurality of sub-electrodes 24 spaced apart from each other. The sub-electrode 24 are arranged in a matrix, arranged in a plurality of rows in a first direction D1, and arranged in a plurality of columns in a second direction D2. The first direction D1 intersects with the second direction D2. In the present embodiment, the first direction D1 is perpendicular to the second direction D2. The sub-electrodes 24 are electrically insulated from each other. The driving circuit 22 applies a voltage to the sub-electrodes 24. The voltage can be a touch driving voltage or a common voltage.

In the present embodiment, the driving circuit 22 applies the touch driving voltage and the common voltage to the sub-electrodes 24 in time division manner. The sub-electrodes 24 serve as the common electrodes and are multiplexed as touch electrodes. When the sub-electrodes 24 serve as the common electrodes, each sub-electrode 24 receives the common voltage from the driving circuit 22 to display an image. When the sub-electrodes 24 serve as the touch electrodes, each sub-electrode 24 receives the touch driving voltage from the driving circuit 22 to detect touch operations and touch positions.

Each sub-electrode 24 is electrically connected the driving circuit 22 and the controlling switch 25 by one first line 26. In the present embodiment, the first lines 26 are formed of a conductive layer (not shown) different from the common electrode layer 23, and an insulating layer (not shown) between the conductive layer and the common electrode layer 23. The insulating layer defines a plurality of via holes 27. Each first line 26 extends through one column of the sub-electrodes 24 in the first direction D1 and the first lines 26 are spaced apart in the second direction D2. Each first line 26 is electrically connected to one sub-electrode 24 by one via hole 27. That is, the sub-electrodes 24 and the first lines 26 have a one-to-one relationship.

In the present embodiment, a section of the first line 26 extending from the driving circuit 22 to the via hole 27 is defined as a first sub-line 262, and a section of the first line 26 extending from the via hole 27 to the controlling switch 25 is defined as a second sub-line 264.

According to the distances of the sub-electrodes 24 from the driving circuit 22, the lengths of the first sub-lines 262 electrically connected to the sub-electrodes 24 of the same column of the sub-electrodes 24 are sequentially decreased or sequentially increased. The lengths of the second sub-lines 264 electrically connected to the sub-electrodes 24 of the same column of the sub-electrodes 24 are sequentially increased or decreased.

In the present embodiment, the controlling switch 25 and the driving circuit 22 are on opposite sides of the sub-electrodes 24 in the first direction D1. The driving circuit 22 is on the bottom side of the substrate 21, and the controlling switch 25 is on the top side of the substrate 21. In each column of sub-electrodes 24, the lengths of the first sub-lines 262 are sequentially decreased in the second direction D2, and the lengths of the second sub-lines 264 are sequentially increased in the second direction D2.

In the present embodiment, some of the first lines 26 are electrically connected to the driving circuit 22 and the first controlling switch 251, and the other first lines 26 are electrically connected to the driving circuit 22 and the second controlling switch 252. In FIG. 4, each first line 26 of the odd numbers is electrically connected to the driving circuit 22 and the first controlling switch 251, and each first line 26 of the even numbers is electrically connected to the driving circuit 22 and the second controlling switch 252.

In the present embodiment, the number of the third lines 28 is two. One of the third lines 28 is electrically connected to the driving circuit 22 and the first controlling switch 251 and the other one of the third lines 28 is electrically connected to the driving circuit 22 and the second controlling switch 252. The driving circuit 22, by the third lines 28, turns on or turns off the first and second controlling switches 251 and 252.

In the present embodiment, the number of the second lines 29 is two. One of the second lines 29 is electrically connected to the driving circuit 22 and the first controlling switch 251, and the other one of the second lines 29 is electrically connected to the driving circuit 22 and the second controlling switch 252.

During a display period, the sub-electrodes 24 serve as common electrodes to receive the common voltage. The driving circuit 22 controls the first controlling switch 251 and the second controlling switch 252 to be turned on by the two third lines 28.

The driving circuit 22 is electrically connected to each odd-numbered second sub-line 264 by one of the two second lines 29. The driving circuit 22 is electrically connected to each even-numbered second sub-line 264 by the other one of the two second lines 29. The driving circuit 22 applies a first common voltage to each sub-electrode 24 of the odd-numbered columns by the odd-numbered first sub-lines 262. The driving circuit 22 applies a first common voltage to each sub-electrode 24 of the even-numbered columns by the even-numbered first sub-lines 262.

At the same time, the driving circuit 22 applies a second common voltage to each sub-electrode 24 of the odd-numbered columns by the odd-numbered second sub-lines 264. The driving circuit 22 applies a second common voltage to each sub-electrode 24 of the even-numbered columns by the even-numbered second sub-lines 264. The first common voltage equals the second common voltage.

The RC loading (resistive capacitive load) of the sub-electrodes 24 away from the drive circuit 22 is reduced by the influence of the double-driving. Thus, the common voltage uniformity on different sub-electrodes 24 is improved, and the display of an image is improved.

During a touch period, the sub-electrodes 24 serve as self-capacitance sub-electrodes to receive the touch driving voltage. The driving circuit 22 controls the first controlling switch 251 and the second controlling switch 252 to be turned off by the two third lines 28, the second lines 29 are not electrically connected to the first lines 26. The driving circuit 22 applies an alternating voltage to each sub-electrode 24 by each first sub-line 262 as a touch driving voltage. The alternating voltage may be a sine wave, a square wave, a triangular wave, a sawtooth wave, or the like.

When a conductive object (such as a fingertip) touches a touch surface of the touch display panel 100, the capacitance sensing signal at the touch position is different. The driving circuit 22 receives and processes the capacitance sensing signal of each sub-electrode 24. By processing and calculating the differences in the capacitance sensing signals, the coordinates of the touch position can be determined.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A thin film transistor array substrate, comprising:
a substrate;
a common electrode layer on the substrate, the common electrode layer comprising a plurality of sub-electrodes spaced apart from each other;

a driving circuit on the substrate, the driving circuit configured to apply voltages to the plurality of sub-electrodes;

a controlling switch on the substrate;

a plurality of first lines, each sub-electrode electrically connected to the driving circuit and the controlling switch by at least one of the first lines; and at least one second line, the at least one second line electrically connected to the driving circuit and the controlling switch, wherein when the controlling switch is turned on, the at least one second line is electrically connected to the first lines, and the driving circuit applies a common voltage to each sub-electrode;

wherein the controlling switch comprises a first controlling switch and a second controlling switch; and some of the sub-electrodes are electrically connected to the driving circuit and the first controlling switch, and other sub-electrodes are electrically connected to the driving circuit and the second controlling switch.

2. The thin film transistor array substrate of claim 1, wherein when the controlling switch is turned off, the at least one second line is not electrically connected to the first lines, and the driving circuit applies a touch driving voltage to each sub-electrode.

3. The thin film transistor array substrate of claim 1, further comprising at least one third line; wherein the third line is electrically connected to the driving circuit and the controlling switch, and the driving circuit controls the controlling switch to be turned on and turned off by the third line.

4. The thin film transistor array substrate of claim 1, wherein the thin film transistor array substrate defines a touch area and a non-touch area surrounding the touch area, the common electrode layer is in the touch area, and the driving circuit and the controlling switch are in the non-touch area.

5. The thin film transistor array substrate of claim 1, wherein the driving circuit and the controlling switch are on opposite sides of the sub-electrodes.

6. The thin film transistor array substrate of claim 1, wherein the first lines and the sub-electrodes are in different layers, and each first line is electrically connected to one of the sub-electrodes by a via hole.

7. The thin film transistor array substrate of claim 1, wherein the sub-electrodes are arranged in a matrix of rows and columns.

8. The thin film transistor array substrate of claim 7, wherein each line extends through one column of the sub-electrodes in a first direction, the first lines are spaced apart in a second direction, and the second direction intersects with the first direction.

9. A touch display panel, comprising a color filter substrate, a thin film transistor array substrate, and a liquid crystal layer between the color filter substrate and the thin film transistor array substrate, the thin film transistor array substrate comprising:

a substrate;

a common electrode layer on the substrate, the common electrode layer comprising a plurality of sub-electrodes spaced apart from each other;

a driving circuit on the substrate, the driving circuit configured to apply voltages to the plurality of sub-electrodes;

a controlling switch on the substrate;

a plurality of first lines, each sub-electrode electrically connected to the driving circuit and the controlling switch by at least one of the first lines; and at least one second line, the at least one second line electrically connected to the driving circuit and the controlling switch, wherein when the controlling switch is turned on, the at least one second line is electrically connected to the first lines, and the driving circuit applies a common voltage to each sub-electrode;

wherein the controlling switch comprises a first controlling switch and a second controlling switch; and some of the sub-electrodes are electrically connected to the driving circuit and the first controlling switch, and other sub-electrodes are electrically connected to the driving circuit and the second controlling switch.

10. The touch display panel of claim 9, wherein when the controlling switch is turned off, the second line is not electrically connected to the first lines, and the driving circuit applies a touch driving voltage to each sub-electrode.

11. The touch display panel of claim 9 further comprising at least one third line; wherein the third line is electrically connected to the driving circuit and the controlling switch, and the driving circuit controls the controlling switch to be turned on and turned off by the third line.

12. The touch display panel of claim 9, wherein the thin film transistor array substrate defines a touch area and a non-touch area surrounding the touch area, the common electrode layer is in the touch area, and the driving circuit and the controlling switch are in the non-touch area.

13. The touch display panel of claim 9, wherein the driving circuit and the controlling switch are on opposite sides of the sub-electrodes.

14. The touch display panel of claim 9, wherein the first lines and the sub-electrodes are in different layers, and each first line is electrically connected to one of the sub-electrodes by a via hole.

15. The touch display panel of claim 9, wherein the sub-electrodes are arranged in a matrix of rows and columns.

16. The touch display panel of claim 15, wherein each first line extends through one column of the sub-electrodes in a first direction, the first lines are spaced apart in a second direction, and the second direction intersects with the first direction.

* * * * *